United States Patent [19]

Kushibe et al.

[11] Patent Number: 4,928,285
[45] Date of Patent: May 22, 1990

[54] IMPURITY-DOPED SEMICONDUCTOR LASER DEVICE FOR SINGLE WAVELENGTH OSCILLATION

[75] Inventors: Mitsuhiro Kushibe, Tokyo; Kazuhiro Eguchi, Yokohama; Masahisa Funamizu, Tokyo; Yasuo Ohba, Yokohama, all of Japan

[73] Assignee: Kabushiki Kaisha Toshiba, Kawasaki, Japan

[21] Appl. No.: 314,176

[22] Filed: Feb. 23, 1989

[30] Foreign Application Priority Data

Feb. 23, 1988 [JP] Japan .................................. 63-40118
Feb. 23, 1988 [JP] Japan .................................. 63-40119

[51] Int. Cl.$^5$ ............................................. H01S 3/19
[52] U.S. Cl. ........................................ 372/45; 372/46; 357/16; 357/17; 357/61
[58] Field of Search ..................... 372/45, 46, 44, 43; 357/17, 16, 61

[56] References Cited

U.S. PATENT DOCUMENTS

| | | | |
|---|---|---|---|
| 4,132,960 | 1/1979 | Streifer et al. | 372/45 |
| 4,193,044 | 3/1980 | Morrison et al. | 372/43 |
| 4,737,960 | 4/1988 | Tsang | 372/45 |

OTHER PUBLICATIONS

Appl. Phys. Lett., 50, 1313; J. P. Van der Ziel et al.; May 11, 1987; "Single Longitudinal Mode Operation of Er-Doped 1.5 μm InGaAsP Lasers".
Appl. Phys. Lett., 49, 1686; W. T. Tsang and R. A. Logan; Dec. 22, 1986; "Observation of Enhanced Single Longitudinal Mode Operation in 1.5 μm GaInAsP Erbium-Doped Semiconductor Injection Lasers".

*Primary Examiner*—William L. Sikes
*Assistant Examiner*—Georgia Y. Epps
*Attorney, Agent, or Firm*—Oblon, Spivak, McClelland, Maier and Neustadt

[57] ABSTRACT

An impurity-doped double-heterostructure semiconductor laser adapted for single-longitudinal-mode operation is disclosed which includes a semiconductive substrate and a mesa of double-heterostructure formed over the substrate. The mesa comprises an active layer serving as a light-emitting layer, a waveguiding layer adjacent to the active layer and clad layers interposing the active layer and the waveguiding layer therebetween. A high-resistively layer is formed to bury the lateral surfaces of the mesa. The active layer contains impurities of a rare earth element with a previously selected concentration. The limited concentration of impurities is high enough to confine only light components falling within a specific range of wavelength, of all the light components produced in the active layer when the laser device is operative, within the active layer so as to provide single wavelength laser oscillation and low enough to inhibit the initiation of spontaneous emission of the rare earth element within the active layer. For example, the concentration may be set to $1 \times 10^{18}$ cm$^{-3}$ or below.

21 Claims, 7 Drawing Sheets

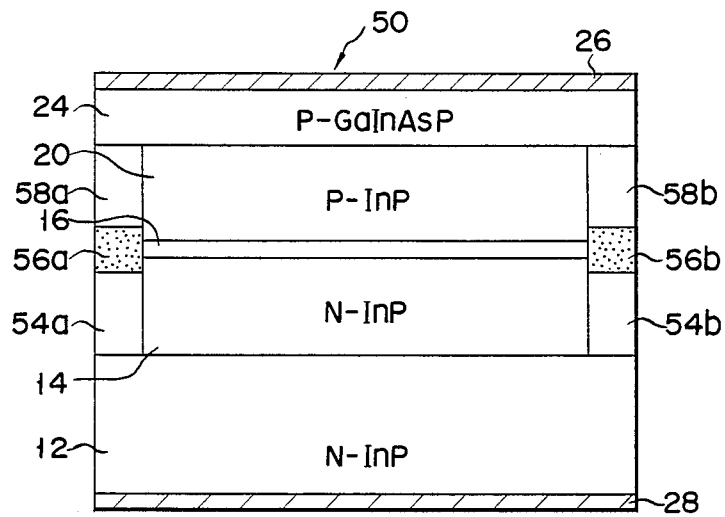
F I G. 5
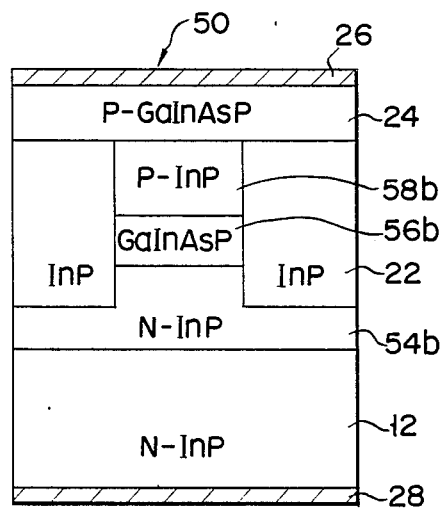
F I G. 6

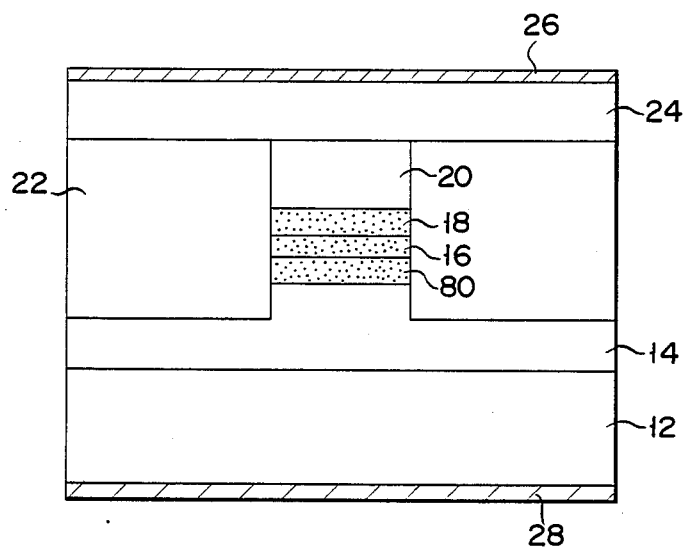
F I G. 11
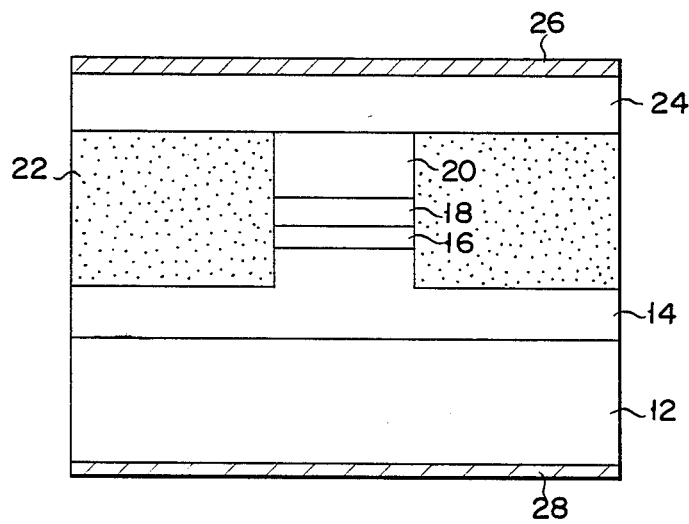
F I G. 12

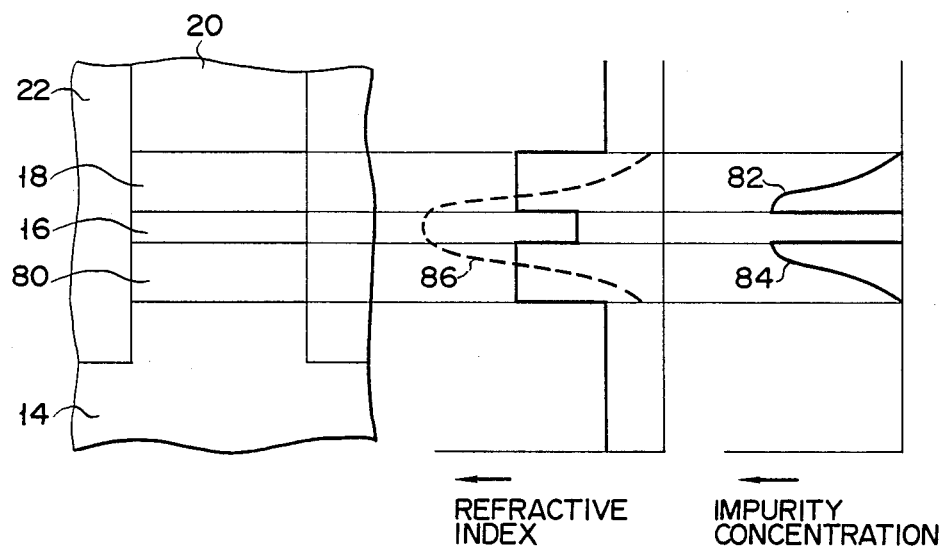
F I G. 13

IMPURITY-DOPED SEMICONDUCTOR LASER DEVICE FOR SINGLE WAVELENGTH OSCILLATION

BACKGROUND OF THE INVENTION

1. Field of the Invention

The present invention relates to a semiconductor laser device for single-longitudinal-mode operation.

2. Description of the Related Art

Many of presently available semiconductor laser devices of heterostructure usually operate in multimode to emit laser light. To obtain a single-mode oscillation spectrum, distributed feedback (DFB) lasers, distributed Bragg reflector (DBR) and so on have been proposed. In accordance with semiconductor lasers of this type, on part of a semiconductor substrate a diffraction grating consisting of periodic grooves is formed which feeds back or reflects only a specific wavelength to obtain the single-longitudinal-mode operation, or the single wavelength laser oscillation.

In accordance with the semiconductor lasers using the diffraction grating, however, it is difficult to realize a good sideband suppression ratio. If the side-band suppression ratio is poor, the characteristics of the single-longitudinal-mode operation of the semiconductor laser will be degraded in a high-speed modulation operation. Moreover, with existing manufacturing technology, it is extremely difficult to form the diffraction grating in the semiconductor lasers of that type with as high precision as desired and as high manufacturing yield as desired. One of the reasons is complication of the manufacturing process due to practice of the holographic interferometer system or two-beam interference exposure system. To form a diffraction grating whose shape is controlled with relatively high precision, it is required to use the two-beam interference exposure technique which needs a highly complex control system. This will lower the efficiency of manufacture of semiconductor lasers. Another reason is a break in the shape of the diffraction grating due to high temperatures involved in the epitaxial growth process. Even if a diffraction grating closely controlled in shape is initially obtained in manufacture of a semiconductor laser, the diffraction grating will not be able to retain its shape due to high temperatures involved in epitaxially growing single-crystal semiconductor materials on the diffraction grating.

A semiconductor laser device that oscillates at a single wavelength without using a diffraction grating is described by J. P. Van der Ziel at al in Appl. Phys. Lett., 50 (1987) page 1313. The described semiconductor laser includes an active layer which is doped or added with a rare earth element, such as ytterbium (Yb) or erbium (Er), at high impurity concentration. When the semiconductor laser is excited to emit light, the rare earth element emits light spontaneously because of the transition of f electrons between their orbits. The single-mode laser oscillation is made possible by the use of the spontaneous emission from the rare earth element.

With this type of semiconductor laser, however, to effectively utilize the spontaneous emission from the rare earth element itself for oscillation of laser light, the active layer must be doped with impurities of an rare earth element in great quantity. The doping with a large quantity of impurity of rare earth element will adversely affect the crystalline quality of the active layer so that the property of interface between the active layer and an epitaxially grown semiconductor material formed thereon is deteriorated. The degradation of the crystalline quality of the active layer would increase the oscillation threshold of the semiconductor laser, thus deteriorating its basic characteristics for oscillation. Furthermore the doping of the active layer with a great quantity of rare-earth impurity will result in undesired precipitation of impurity in the multilayer structure of a semiconductor laser. This fact will lead to phenomena such as an increase in threshold current and decreases in light-emitting efficiency and lifetime.

SUMMARY OF THE INVENTION

It is accordingly an object of the present invention to provide a new and improved semiconductor laser device which is excellent in basic device characteristics and good at the single-longitudinal-mode operation.

It is another object of the present invention to provide a new and improved semiconductor laser device which enables the single-longitudinal-mode operation without forming a diffraction grating and has basic device characteristics that are as good as those of a semiconductor laser the active layer of which is not doped with a rare earth element.

In accordance with the above objects, the present invention is addressed to a specific semiconductor laser device, which comprises a semiconductive substrate; and a semiconductive layer formed over said substrate and acting as a light-emitting layer. The semiconductor layer is doped with impurities of a rare earth element with a specific doping concentration that is high enough to confine only light components falling within a specific range of wavelength, of all the light components produced in the layer when the laser device is operative, within the layer so as to provide single wavelength laser oscillation and low enough to inhibit the degradation of emission efficiency (intensity of light emission) of the layer due to the deterioration in crystallinity thereof.

The light-emitting layer is varied in refractive index and/or reflectance by addition of the impurities. As a result of this, if only light components of specific wavelengths are confined within the light-emitting layer, then the light produced by the laser device virtually contains, only light components falling within a specific range of wavelengths so that single wavelength laser oscillation is provided. Since spontaneous emission of the impurities of rare earth element contained in the light emitting layer is not essentially utilized to obtain the single wavelength laser oscillation, the concentration of the impurities in the light-emitting layer can be low ($1 \times 10^{18}$ cm$^{-3}$ or below). Therefore, crystalline deterioration of the light-emitting layer due to heavy doping with impurities can be minimized so that the semiconductor laser has good basic device characteristics.

Instead of the light emitting layer, the impurities of rare earth element may be added to at least one of neighboring layers of the light emitting layer at least partly, which include clad layers, a waveguiding layer and a high-resistivity burying layer. In this case, since the light-emitting layer is not fundamentally doped with impurities, the impurity concentration in the neighboring layers can be selected freely. The impurities may be added not only to the neighboring layers but also to the light-emitting layer. In this case, the light-emitting layer is doped with the impurities with the specifically selected concentration described above.

The invention and its objects and advantages will become more apparent from the detailed description of the preferred embodiments presented hereinafter.

BRIEF DESCRIPTION OF THE DRAWINGS

In the following description of a preferred embodiment of the invention presented below, reference is made to the accompanying drawings of which:

FIG. 5 is a sectional view taken along line V—V of FIG. 4;

FIG. 6 is a sectional view taken along line VI—VI of FIG. 4;

FIGS. 9 through 12 are schematic cross-sectional views of typical modifications of the semiconductor laser of FIG. 8; and FIG. 13 is a fragmentary cross-sectional view of the mesa of the double-heterostructure of a semiconductor laser which is a modification of the semiconductor laser of FIG. 10 and illustrates refractive index and impurity concentration profiles along the section.

DETAILED DESCRIPTION OF THE PREFERRED EMBODIMENTS

Figure 1:
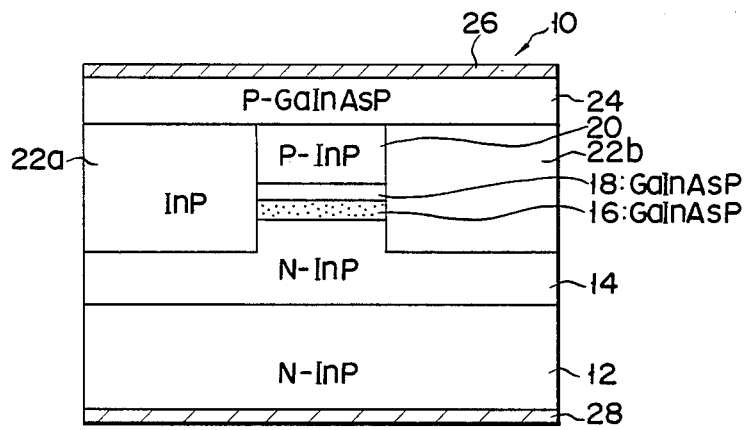
FIG. 1 is a cross-sectional view of a semiconductor laser according to a preferred embodiment of the invention.

Referring now to FIG. 1, a double-heterostructure semiconductor laser according to a preferred embodiment of the present invention is generally designated by reference numeral 10. Semiconductor laser 10 has an InP substrate 12 of N type conductivity. An N-type InP clad layer 14 is formed on InP substrate 12. Clad layer 14 serves also as a buffer layer. A stripe mesa of double-heterostructure is formed on clad layer 14. The stripe mesa is comprised of an Er doped GaInAsP active layer 16, a GaInAsP waveguiding layer 18 and a P-type InP clad layer 20 which are sequentially grown.

As shown in FIG. 1, side surfaces (lateral surfaces) of the stripe mesa are buried by high-resistivity InP layers 22a and 22b (referred to as high-resistivity layer 22 hereinafter) which serve as current blocking layers. The uppermost layer of the stripe mesa, or clad layer 20 is flush with the upper surface of high-resistivity layer 22. A p-type GaInAsP contact layer 24 is formed over layers 20, 22. An Au/AuZn layer 26 serving as a P-side electrode is formed on contact layer 24, whereas an Au/AuGe layer 28 serving as an N-side electrode is formed on the underside of substrate 12.

Semiconductor laser 10 having such a laser structure as described above is featured in that active layer 16 is increased in its gain for light emission at a specific wavelength by limiting the doping level of the rare-earth impurities for active layer 16 (in FIG. 1, fine dots are used to visualize the doping of the active layer with the rare-earth impurities well) to a previously selected level and utilizing changes in refractive index and/or reflectance due to the doping with rare earth metal, thus realizing a good single oscillation mode. Since the light emission of the rare earth element itself is not utilized for single-longitudinal-mode operation of the laser, the doping level of impurities of the rare earth element in active layer 16 can be low. Hence the deterioration of the basic device characteristics, such as the decrease of intensity of light emission, due to the degradation of active layer 16 in crystallinity, which results from the heaving doping with impurities, can be minimized.

More specifically, semiconductor laser 10 can be distinguished from conventional rare-earth-element-doped semiconductor lasers in that the single wavelength oscillation spectrum is obtained not by utilizing the light emission of the rare earth element itself but by utilizing the dispersion of wavelengths in light emitting active layer 16 based on changes in refractive index and/or reflectance resulting from lightly doping the active layer with the rare earth element. As described previously, the single-mode laser oscillation of conventional semiconductor lasers heavily doped with the rare earth element has been guessed to be due to the light emission of the rare earth element itself. Thus it was absolutely necessary for the active layer to be heavily doped with the rare earth element (the doping concentration will be $1 \times 10^{19}$ $cm^{-3}$ or above). However, the intensive researches and experiments conducted by the present inventors demonstrate that the utilization of an improvement in the wavelength dispersion characteristics of the light emitting layer resulting from changes in refractive index and/or reflectance, which are due to the light doping with the rare earth element, permits the confinement of only light components of specific wavelengths to the light-emitting layer (increase in gain for the light components of the specific wavelengths), thus providing stable laser oscillation at a desired wavelength, i.e., single mode oscillation. Moreover it is confirmed that such a phenomenon of confinement of light of a single wavelength takes place with a low doping concentration of $1 \times 10^{18}$ cm$^{-3}$ or below. The concentration of impurities of the rare earth metal in active layer 16 may lie in the range from $1 \times 10^{15}$ to $1 \times 10^{18}$ cm$^{-3}$.

Figure 2:
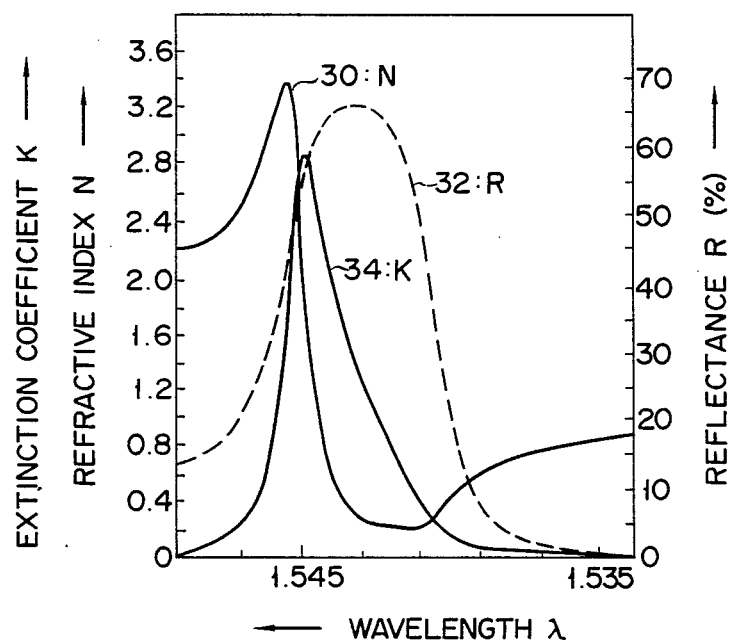
FIG. 2 is a graph showing the characteristic spectra of the semiconductor laser of FIG. 1.

FIG. 2 shows the characteristic spectrum of a semiconductor laser lightly doped with impurities of rare earth element ($1 \times 10^{18}$ cm$^{-3}$ or below) in which solid line 30 represents change of refractive index N, broken line 32 change of reflectance R and solid line 34 change of extinction coefficient K. As will be clear from the graph, where active layer 16 is lightly doped with a doping concentration of $1 \times 10^{18}$ cm$^{-3}$ or below, there is a strong tendency in active layer 16 for refractive index N, reflectance R and extinction coefficient K to have a peak at a specific wavelength because of the f-electron transition in the added rare earth element. This means that active layer 16 is insensitive to other wavelengths than the specific wavelengths. Only light components lying in a specific limited range of wavelengths are reflected, absorbed, dispersed and amplified within active layer 16. At the same time, other light components than the light components of specific wavelengths are suppressed within active layer 16. Therefore, the density of the light components lying in the specific wavelength range abruptly increases within active layer 16 so that the semiconductor laser operates in a single mode.

In accordance with this embodiment, the heavy doping of the active layer with the rare earth element is not required for providing the single wavelength laser oscillation. In other words, even if the doping concentration of the rare earth element is decreased, good single mode oscillation can be provided. Hence the deterioration of crystallinity of active layer 16 resulting from the addition of impurities can be inhibited. That is, the surface condition of crystal of active layer 16 improves and thus the property of interface between active layer 16 and a semiconductor layer adjacent thereto improves. These improvements will lead to not only improved basic characteristics of the semiconductor laser but also various merits such as lower threshold current, higher light-emitting efficiency and longer life of semiconductor laser 10. Moreover, since the effect of confinement of light of a single wavelength occurs in a region of relatively narrow wavelengths, a single-mode semiconductor laser capable of high-speed modulation adapted for optical fiber communications can be provided. For example, where erbium (Er) is used as rare earth element, a light component of a wavelength of about 1.54 $\mu$m can effectively be obtained in a single mode.

Figure 3A:
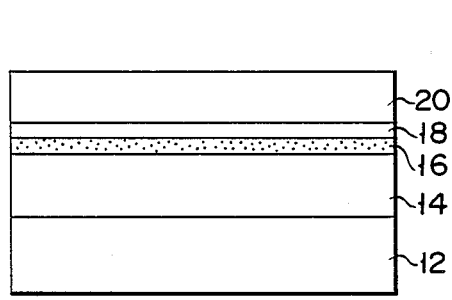
FIGS. 3A through 3D are cross-sectional views in main steps of manufacture of the semiconductor laser of FIG. 1.

A manufacturing method of the laser structure described previously will be described. As shown in FIG. 3A, first a double-heterojunction is formed by sequentially growing N-type InP clad layer 14, Er-doped GaInAsP active layer 16, GaInAsP waveguiding layer 18 and P-type InP clad layer 20 over N-type substrate 12. N-type InP clad layer 20 has a thickness of 1 $\mu$m. GaInAsP active layer 16 is 0.1 $\mu$m in thickness. GaInAsP waveguiding layer 18 is 0.1 $\mu$m thick. P-type InP clad layer 20 is 1 $\mu$m thick. Active layer 16 is doped with Er with the doping concentration of the order of $10^{17}$ to $10^{18}$ cm$^{-3}$.

Subsequently a SiO$_2$ layer 36 of stripe form is deposited. Using SiO$_2$ layer 36 as a mask, the multilayer structure is subjected to selective etching to obtain such a layered mesa structure or stripe mesa 38 as shown in FIG. 3B. In this case, the etching process is stopped when clad layer 14 is reached.

Figure 3C:
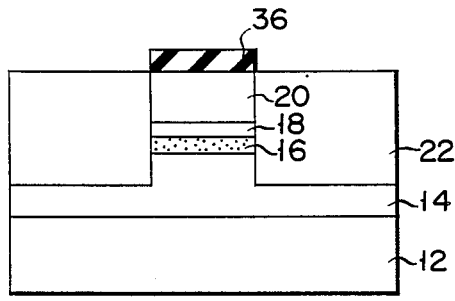
Figure 3B:
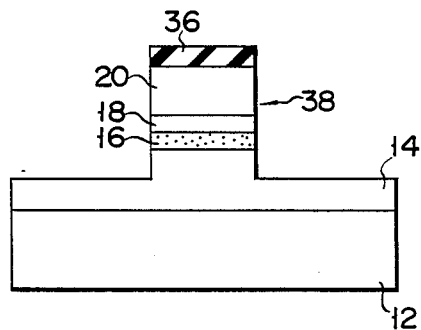
Figure 3D:
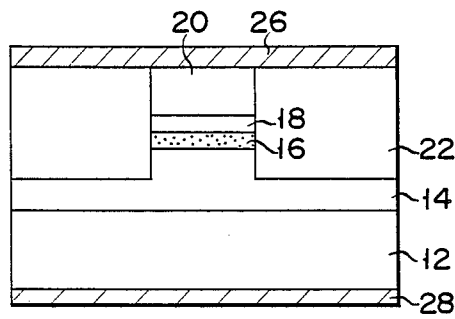

Afterward, InP high-resistivity layer 22 is formed by epitaxial growth so as to bury the lateral surfaces of mesa structure 38 as shown in FIG. 3C. After the removal of SiO$_2$ layer 36, P-type GaInAsP contact layer 26 is formed to a thickness of 0.5 $\mu$m as shown in FIG. 3D. Electrode layers 26, 28 are formed on the opposite surfaces of the resultant structure. Finally, the cleaving process is performed to form the front and rear surfaces of a resonator, thereby completing the laser structure of FIG. 1.

In the above manufacturing process, each semiconductor layer was grown using the metal organic chemical vapor deposition (MOCVD) technique. As materials for epitaxy growth, trimethylgarium (TMG), trymethlyindium (TMI), phosphine (PH$_3$) and arsine (AsH$_3$) were used. As a material for Er, Er(CH$_3$-C$_5$H$_4$)$_3$ or Er(C$_5$H$_5$)$_3$ was used. The resonator with cleaved facets was about 250 $\mu$m long.

The oscillating wavelength of the resultant semiconductor laser device was about 1.54 $\mu$m, and good single-longitudinal-mode oscillation characteristics were obtained. This is because the wavelength dispersion in reflectance having a sharp peak at 1.54 $\mu$m were realized in Er-doped active layer 16 as described previously. The oscillation threshold current was about 120 mA which is approximately equal to that of Er-undoped semiconductor lasers. This is because the doping concentration of rare earth element is low. The threshold current of 120 mA is much better than 180 mA of Er heavily doped semiconductor lasers.

Figure 4:
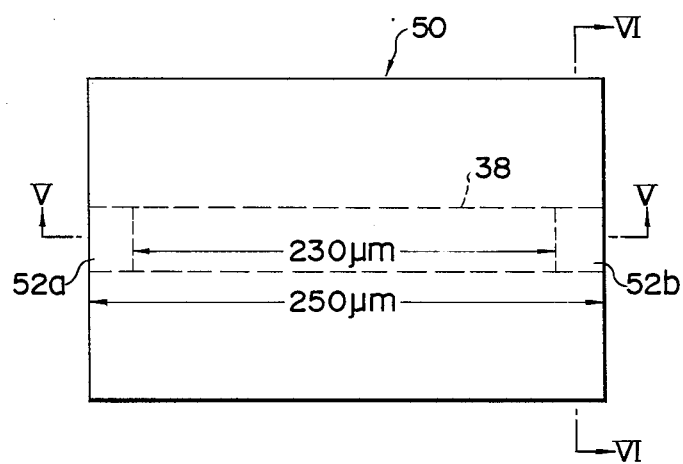
FIG. 4 is a plan view of the main part of a semiconductor according to a second embodiment of the invention.

Referring to FIGS. 4 and 5, a semiconductor laser according to a second embodiment of the present invention is generally designated by reference numeral 50. In these figures, like reference numerals are used to designate like parts in the first embodiment described above and their detailed description is omitted.

The second embodiment is different from the previously described embodiment in that the rare earth element is not uniformly added to active layer 16 but partly added to only regions near the opposite end portions (i.e., ends opposed to each other in the waveguiding direction, called "resonator end surfaces") along the lengthwise dimension of the stripe mesa. That is, in one end portion 52a of the opposite end portions of stripe mesa 38 of semiconductor laser 50 along its lengthwise dimension, N-type InP clad layer 54a, Er-doped GaInAsP active layer 56a and P-type InP clad layer 58a are formed as shown in FIG. 5. In the other end portion 58b, Er-doped N-type InP clad layer 54b, Er-doped GaInAsP active layer 56b an P-type InP clad layer 58b are formed as shown in FIG. 5. The sectional structure of the end portions is shown in FIG. 6. This semiconductor laser 50 is not provided with waveguiding layer 18, but it may be provided as in the previous embodiment. GaAsInP active layers 56a and 56b may be replaced with InP window layers. In this case, since these window layers do not contribute to the laser oscillation, the light-emitting efficient will not be degraded if Er is heavily doped in the window layers.

To manufacture semiconductor laser shown in FIGS. 4 to 5, first, N-type InP 14 of 1 $\mu$m thick, GaInAsP active layer 16 of 0.1 $\mu$m and P-type InP clad layer 20 of 1 $\mu$m thick are sequentially formed over N-type InP substrate 12 by means of an epitaxial growth technique. Next, SiO$_2$ mask layer 60 is formed on clad layer 20 as shown in FIG. 7A and then parts of clad layer 20, active layer 16 and clad layer 14 are removed by chemical etching to leave a stripe of 230 $\mu$m wide.

Afterward, InP clad layer 54 (0.9 $\mu$m thick), Er-doped GaInAsP active layer 56 (0.3 $\mu$m thick) and Er-doped P-type InP clad layer 58 are sequentially grown using SiO$_2$ mask layer 60. Mask layer 60 is subsequently etched away using hydrofluoric acid etchant.

Figures 7A, 7B, 7C:
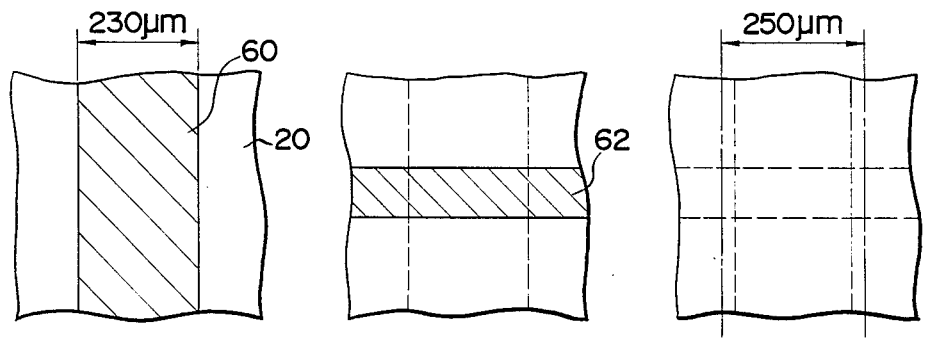
FIGS. 7A through 7C are plan views of main parts in main steps of manufacture of the semiconductor laser shown in FIGS. 4 through 6.

An SiO$_2$ mask layer 62 is next formed on clad layers 20, 58 as shown in FIG. 7B. Using mask 62, clad layers 20, 58, active layers 16, 56 and clad layers 14, 54 are sequentially selectively ethched by hydrochloric acid or hydrogen peroxide etchant, thereby forming a stripe structure extending in the direction in which resonator end surfaces of the Er-doped layers are formed to oppose to each other. Subsequently, using SiO$_2$ mask 62, Fe-doped InP high-resistivity layer 22 is formed to bury lateral surfaces of the stripe. Moreover, P-type GaInAsP contact layer 24 is formed to a thickness of 0.5 $\mu$m. Finally, elctrode layers 26, 28 are formed on the opposite surfaces of the resultant structure so that the laser device is completed. In the cleaving stage of manufacture of the laser device, the substrate crystal was cleaved so that the length of resonator might become 250 $\mu$m and thus the Er-doped layers might be left at the end portions of the resonator.

In accordance with the semiconductor laser thus manufactured, the single-mode oscillation was obtained at a wavelength of about 1.54 $\mu$m. This is because, as discussed previously, the wavelength dispersion in reflectance having a sharp peak at 1.54 μm is realized between Er-doped active layer 56 and Er-undoped active layer 16. The oscillation threshold current of semiconductor laser 50 was 20 mA, which is far superior to about 120 mA achieved with semiconductor laser 10 of the conventional laser having an active layer heavily doped with Er. This is because the rare earth element is not added to light-emitting active layer 16. Hence this embodiment can provide not only the same advantage as the previous embodiment but also better device characteristics Unlike the addition of impurities to the center portion of the active layer, the addition of impurities to only regions near the resonator end surfaces will not encounter problems such as an increase of oscillation threshold due to the deterioration of crystal quality. Therefore, the doping concentration can be $1 \times 10^{15}$ cm$^{-3}$ or above, at which the wavelength selection occurs in the case of rare earth elements.

Figure 8:
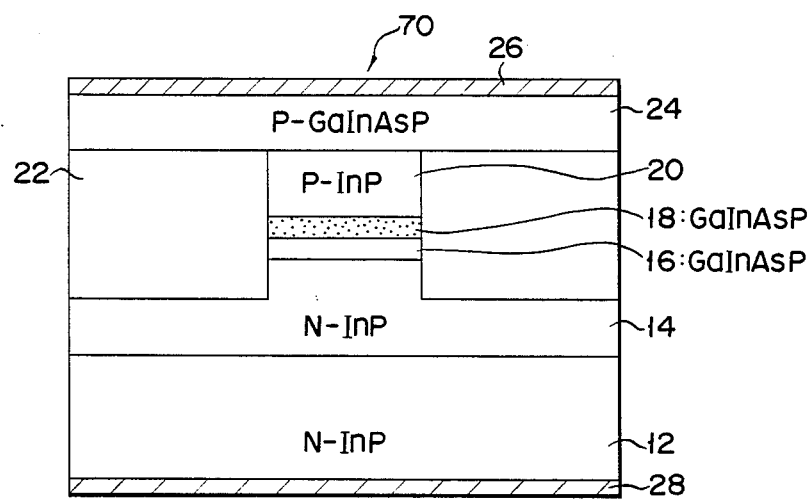
FIG. 8 is a cross-sectional view of a semiconductor laser according to a third embodiment of the invention.

Referring now to FIG. 8, a semiconductor laser according to a third embodiment of the invention is generally designated by reference numeral 70. This semiconductor laser 70 is different from semiconductor laser 10 of FIG. 1 in that impurities of rare earth element are not added to active layer 16 but added substantially uniformly to waveguiding layer 18 adjacent to active layer 16. The other parts of semiconductor laser 70 are identical to those of semiconductor laser 10 of FIG. 1 and thus their detailed description is omitted for the sake of simplification.

Unlike the previous embodiments, where impurities of rare earth element are added to waveguiding layer 18, there is no problem of an undesired increase in the oscillation threshold resulting from the deterioration of crystal quality in active layer 16 due to addition of the rare earth element. Thus, the doping concentration of the rare earth element can be set relatively freely and moreover at a high level. However, the doping concentration of the rare earth element in waveguiding layer 18 should be controlled to a level required to provide the "single-wavelength confinement" effect discussed previously. In this embodiment, for example, Er is added to waveguiding layer 18 with a doping concentration lying in the range $1 \times 10^{17}$ to $1 \times 10^{18}$ cm$^{-3}$. Such an arrangement can provide good single-mode oscillation characteristics of the semiconductor laser without addition of impurities of the rare earth element to active layer 16. This will allow expansion of the degree of freedom to set the doping concentration of the rare earth element in active layer 16 without worrying about the deterioration of crystallinity due to the addition of the rare earth element. It should be noted that when Er is added to waveguiding layer 18 in manufacturing semiconductor laser 70, Er is also diffused to the underlying active layer 16. However, according to the actual measurement results, the doping amount of Er diffused into active layer 16 was so small as to be below one tenth of that into waveguiding layer 18.

The semiconductor laser of the present invention may be modified in various ways as shown below. Some typical examples will be described with reference to FIGS. 9 to 12.

Figure 9:
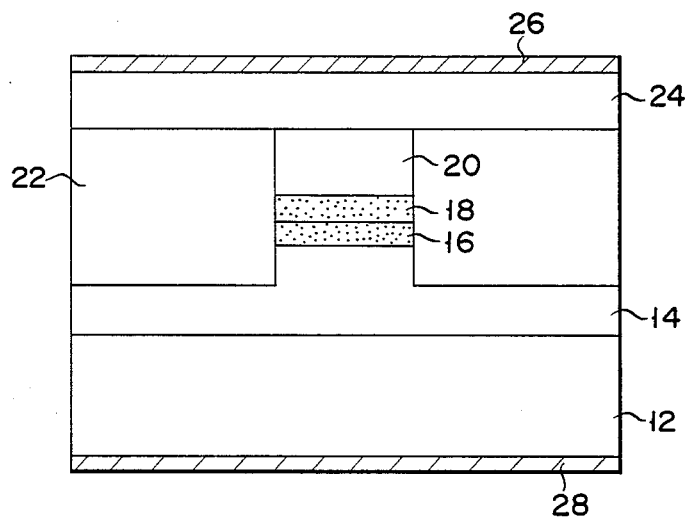

According to an example shown in FIG. 9, impurities of the rare earth element are added to both active layer 16 and waveguiding layer 18. The concentration of the rare earth element in waveguiding layer 18 is $1 \times 10^{18}$ cm$^{-3}$ or below. In active layer 1, the concentration of the rare earth element is approximately equal to that in waveguiding layer 18. According to our measurement results, the oscillation wavelength of this modification was about 1.54 μm and its oscillation threshold was about 18 mA.

Figure 10:
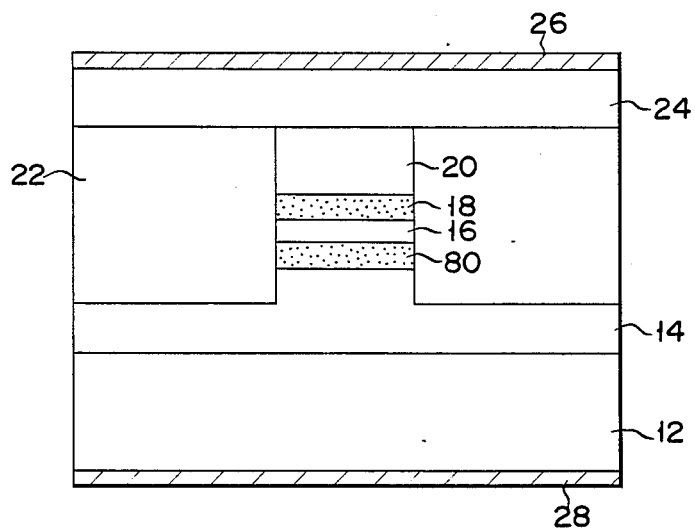

A modification shown in FIG. 10 differs from semiconductor laser 70 of FIG. 8 in that an additional waveguiding layer 80 is provided on the top surface of a protruding or convex portion of clad layer 14. The rare earth element is not essentially added to active layer 16, but it is added to upper and lower waveguiding layers 18 and 80 between which active layer 16 is sandwiched instead. The concentration of the rare earth element in waveguiding layers 18, 80 is $1 \times 10^{18}$ cm$^{-3}$ or below. According to our measurement results for this modification, the oscillation wavelength was about 1.54 μm and the oscillation threshold was 25 mA, providing good single wavelength oscillation characteristics as is the case with the previously described semiconductor lasers. With such an arrangement, since Er-undoped active layer 16 is sandwiched between Er-doped waveguiding layers 18 and 80, the symmetry property of the laser oscillation mode can be improved. This is because a fixed amount of rare earth element is continuously added to both sides of active layer 16 without variations in a supply of material at a time of crystal growth and thus the rare earth element can be added to both sides of the active layer more uniformly. That is, since amounts of addition of the rare earth element to both sides of the active layer are symmetrical, symmetrical spread of light to the waveguiding layers is produced and symmetrical laser oscillation mode is achieved.

According to a modification shown in FIG. 11, the rare earth element is added to active layer 16 and waveguiding layers 18, 80. With such an arrangement, a symmetric laser oscillation characteristic, which is better than that of the above modification shown in FIG. 10 is obtained.

In accordance with a modification shown in FIG. 12, the rare earth element is added to InP burying layer 22 of high resistivity adjacent to active layer 16 at least partly. In this example, Er is diffused into high-resistivity layer 22 substantially uniformly at a concentration of $1 \times 10^{19}$ cm$^{-3}$. Er may be added only to layer portions of layer 22 which contact active layer 16. The reason why the concentration of the rare earth element is as high as $1 \times 10^{19}$ cm$^{-3}$ in high-resistivity layer 22 in this example is that the deterioration of crystallinity in active layer 16 due to the addition of rare earth element need not be taken into consideration.

The semiconductor laser of FIG. 10 may be modified, as shown in FIG. 13, in the concentration distribution of impurities of the rare earth element. In FIG. 13, there are shown a fragmentary enlarged sectional view of the mesa of the double-heterostructure of the modified semiconductor laser and its associated profiles of refractive index and impurity concentration. In accordance with the modification, Er is diffused into two waveguiding layers 18 and 80 sandwiching active layer 16 therebetween in such a manner that the concentration is highest at the interface between active layer 16 and each of waveguiding layers 18 and 80 and gradually decreases with increasing distance from the interface as shown by concentration curves 82 and 84. In other words, Er is added to each of waveguiding layers 18 and 80 ununiformly and with gradients. In each of the waveguiding layers, the concentration of Er is highest at the junction with active layer 16 and lowest at the surface portion opposite to the junction.

With such an arrangement, the refractive index of waveguiding layers 18 and 80 is highest only for laser light components with a specific wavelength and moreover the tendency is strongest at the junctions with active layer 16. Accordingly, the light components can effectively be confined within active layer 16. The effect of light confinement is shown by a broken line 86 in FIG. 13. Good single wavelength laser oscillation can be provided by the light confinement effect.

Although the invention has been described with reference to specific embodiments. it will be understood by those skilled in the art that numerous modifications may be made that are within the spirit and scope of the inventive contribution.

For example, in the second embodiment shown in FIGS. 4 to 6, additional layers doped with the rare earth element are provided in the end portions of the resonator as means for adding the rare earth element to the vicinities of the end surfaces of the resonator. Alternatively, the rare earth element may directly be added to the end portions of the resonator by diffusion or ion implantation, for example. In this case, the addition of the rare earth element to both the end surfaces of the resonator is preferred to that to only one of the end surfaces. However, it is confirmed by experiments conducted by the present inventors that the addition of the rare earth element to one of the end surfaces can achieve advantageous effects of the invention to some extent.

The rare earth element used need not be restricted to Er and may be changed appropriately in accordance with a desired oscillation wavelength. For example, where a GaInAsP compound semiconductor with oscillation wavelengths lying in the range 1.2 to 1.6 μm is used as the active layer of the semiconductor laser, Pr, Nd, Pm, Sm, Tb, Dy, Er, Tm or Yb may be used as the rare earth element to be added. For AlGaAs compound semiconductor with oscillation wavelengths of 0.7 to 0.9 μm, Nd, Pm, Dy, Ho, Er or Tm may be used. For AlGaInP compound semiconductor with oscillation wavelengths of 0.6 to 0.7 μm, Pr, Nd, Pm, Ho, Er or Tm may be used.

Moreover, the previously described doping technique for the addition of impurities of rare earth element may be applied not only to the semiconductor lasers with a mesa of double-heterostructure presented above but also to other various types of semiconductor lasers such as constricted mesa lasers, buried crescent lasers, double channel lasers, buried heterostructure lasers, terraced substrate type lasers and transverse junction stripe lasers.

When the present invention is applied to a constricted mesa laser, the impurities of a rare earth element, such as Er, may be doped in any one of a clad layer, a light-guide layer and a burying layer which is positioned at the side of an active layer. The impurities may also be doped in the active layer at the impurity concentration of $1 \times 10^{18}$ cm$^{-3}$.

The present invention may also be applied to a semiconductor laser of buried crescent structure which is known as the "buried crescent laser," wherein a substrate has a V-shaped groove that is partly covered by a cladding layer, on which an active layer is formed to provide a plane top surface. In this case, impurities of a rare earth element may be doped in a current blocking layer, a clad layer and a light guide layer. It is possible that the impurities are doped in an active layer at the concentration of less than $1 \times$ simultaneously $10^{18}$ cm$^{-3}$.

When the invention is applied to a "DC PBH" laser, the impurities of a rare earth element may be doped in any one of a clad layer, a light-guide layer and a current blocking layer. Simultaneously, the impurities may also be doped in an active layer at the concentration of less than $1 \times 10^{18}$ cm$^{-3}$.

When the invention is applied to a terraced substrate type laser, the impurities of a rare earth element may be doped in any one of a clad layer and a light guide layer. Simultaneously, the impurities may be doped in an active layer of the laser of this type at the concentration of less than $10 \times 10^{18}$ cm$^{-3}$.

When the invention is applied to a transverse junction stripe laser, the impurities of a rare earth element may be doped in either a clad layer or a light guide layer. The impurities may also be doped in an active layer at the concentration of less than $10 \times 10^{18}$ cm$^{-3}$.

What is claimed is:

1. In a semiconductor laser device comprising:
    a semiconductive substrate; and
    a stacked semiconductor layer section formed on said substrate and including clad layers, an active layer and a waveguide layer;
    the improvement comprising: said active layer being doped with impurities of a rare earth element with a specific doping concentration so that a single wavelength oscillation spectrum is obtained by utilizing dispersion of wavelengths in the active layer based on changes in at least one of refractive index and reflectance, said specific doping concentration being high enough to confine only light components falling within a specific range of wavelength, of all the light components produced in said layer when said laser device is operative, within said layer so as to provide single wavelength laser oscillation and that is low enough to inhibit the degradation of emission efficiency of said active layer.

2. The device according to claim 1, wherein said impurities are contained substantially uniformly in said active layer.

3. The device according to claim 1, wherein said impurities are contained at least partly in said active layer.

4. The device according to claim 3, wherein said active layer has two end portions opposed to each other in the waveguiding direction in said laser device, and said impurities are contained in at least one of said end portions of said active layer.

5. The device according to claim 4, wherein said impurities are contained in said two end portions of said active layer.

6. The device according to claim 3, wherein said impurities are contained in said active layer at a concentration of $1 \times 10^{18}$ cm$^{-3}$ or below.

7. The device according to claim 6, wherein said impurities are preferably contained in said active layer at a concentration falling within a range of $1 \times 10^{15}$ to $1 \times 10^{18}$ cm$^{-3}$.

8. In a impurity-doped semiconductor laser device comprising:
    a semiconductive substrate of a first conductivity type;
    a stacked semiconductor layer section formed on said substrate and including an active layer serving as a light-emitting layer and plural neighboring layers, including at least a first clad layer and a waveguide layer, formed adjacent the active layer;

a stacked semiconductor layer formed on said substrate, including an active layer serving as a light emitting layer and plural neighboring layers formed adjacent said active layer, including at least a first clad layer and a waveguide layer;

the improvement further comprising at least one of said neighboring layers containing impurities of a rare earth element which are at least partially doped therein.

9. the device according to claim 8, wherein said active layer is restrained from containing said impurities.

10. The device according to claim 8, wherein said neighboring layers includes:

said first clad layer which is of the first conductivity type provided on said substrate, said active layer being formed in said first clad layer to have a side surface;

said waveguide layer provided adjacent to said active layer, for guiding light produced by said active layer;

a second clad layer of a second conductivity type provided on said waveguide layer; and a semiconductive current blocking layer burying the side surface of said active layer.

11. The laser according to claim 10, wherein said active layer is restrained from containing said impurities.

12. The laser according to claim 10, wherein said active layer contains said impurities at least partly at a limited concentration lower than that of the concentration of said impurities in said at least one of said neighboring layers.

13. The laser according to claim 12, wherein said limited concentration is high enough to confine only light components falling within a specific range of wavelength, of all the light components produced in said layer when said laser device is operative, within said layer so as to provide single wavelength laser oscillation and low enough to inhibit the initiation of spontaneous emission of said rare earth element within said layer.

14. The laser according to claim 10, further comprising:

an additional waveguiding layer formed adjacent to said active layer for guiding light produced by said active layer, said waveguiding layer and said additional waveguiding layer interposing said active layer therebetween to form junctions, and said waveguiding layers containing said impurities at least in their surface portions at said junctions.

15. The laser according to claim 14, wherein each of said waveguiding layers contains said impurities substantially uniformly.

16. The laser according to claim 14, wherein each of said waveguiding layers contains said impurities substantially nonuniformly.

17. The laser according to claim 16, wherein each of said waveguiding layers has such a gradually varying impurity concentration that is highest in its surface portion at the junction with said active layer and lowest in its other surface portion opposite to the surface portion at the junction.

18. In a semiconductor laser adapted for single wavelength oscillation comprising:

a semiconductive substrate;

a mesa of heterostructure formed over said substrate having a semiconductive active layer serving as a light-emitting layer and first and second semiconductive layers interposing said active layer therebetween to form junctions; and high-resistivity layers for burying lateral surfaces of said mesa, the improvement wherein said active layer contains impurities of a rare earth element with a concentration of $1 \times 10^{18}$ cm$^{-3}$ or below.

19. The laser according to claim 18, wherein at least one of said first and second semiconductive layers and high-resistivity layer contains said impurities of the rare earth element at least in a region of the junction with said active layer.

20. The laser according to claim 18, wherein at least one of said first and second semiconductive layers and high-resistivity layer contains said impurities of the rare earth element substantially uniformly with a previously selected concentration.

21. The laser according to claim 20, wherein the previously selected concentration is $1 \times 10^{18}$ cm$^{-3}$ or above.

* * * * *